(12) United States Patent
Han et al.

(10) Patent No.: US 12,532,792 B2
(45) Date of Patent: Jan. 20, 2026

(54) FAN-OUT PACKAGING DEVICE USING BRIDGE AND METHOD OF MANUFACTURING FAN-OUT PACKAGING DEVICE USING BRIDGE

(71) Applicants: Byung Joon Han, Seoul (KR); Byung Hoon Ahn, Yongin-si (KR)

(72) Inventors: Byung Joon Han, Seoul (KR); Byung Hoon Ahn, Yongin-si (KR)

(*) Notice: Subject to any disclaimer, the term of this patent is extended or adjusted under 35 U.S.C. 154(b) by 441 days.

(21) Appl. No.: 18/121,769

(22) Filed: Mar. 15, 2023

(65) Prior Publication Data

US 2024/0014111 A1    Jan. 11, 2024

(30) Foreign Application Priority Data

Jul. 5, 2022   (KR) .................. 10-2022-0082753
Aug. 2, 2022   (KR) .................. 10-2022-0095808

(51) Int. Cl.
*H01L 23/538* (2006.01)
*H01L 23/00* (2006.01)
*H01L 23/498* (2006.01)

(52) U.S. Cl.
CPC ........ *H01L 23/49816* (2013.01); *H01L 24/16* (2013.01); *H01L 24/19* (2013.01); *H01L 24/48* (2013.01); *H01L 24/73* (2013.01); *H01L 2224/023* (2013.01); *H01L 2224/16227* (2013.01); *H01L 2224/73267* (2013.01); *H01L 2924/19106* (2013.01)

(58) Field of Classification Search
CPC ............ H01L 23/5381; H01L 23/5386; H01L 23/5385
See application file for complete search history.

(56) References Cited

U.S. PATENT DOCUMENTS

2014/0360767 A1\* 12/2014 Terui ...................... H01L 24/19
                                                                174/261
2020/0176384 A1\* 6/2020 Wu ..................... H01L 25/0655

\* cited by examiner

*Primary Examiner* — Errol V Fernandes
(74) *Attorney, Agent, or Firm* — MUNCY, GEISSLER, OLDS & LOWE, P.C.

(57) ABSTRACT

Disclosed are a fan-out packaging device and a method of manufacturing the fan-out packaging device, and more particularly a fan-out packaging device using a bridge, the fan-out packaging device including a bridge formed at one side of a fan-out package having two or more dies integrated therein, at least one trace formed at the bridge, and a connection terminal formed at an end of the trace, the connection terminal being in contact with a contact terminal of the fan-out package, wherein the different dies integrated in the fan-out package are electrically connected to each other via the bridge.

16 Claims, 3 Drawing Sheets

FAN-OUT PACKAGING DEVICE USING BRIDGE AND METHOD OF MANUFACTURING FAN-OUT PACKAGING DEVICE USING BRIDGE

CROSS-REFERENCE TO RELATED APPLICATION

This application claims priority from Korean Patent Application No. 10-2022-0082753, filed on Jul. 5, 2022, and Korean Patent Application No. 10-2022-0095808, filed on Aug. 2, 2022, in the Korean Intellectual Property Office, the disclosure of which is incorporated herein by reference in its entirety.

BACKGROUND OF THE INVENTION

1. Field of the Invention

The present invention relates to a fan-out packaging device using a bridge configured such that the degree of freedom in trace design is improved in a fan-out packaging process and a method of manufacturing the fan-out packaging device.

2. Description of the Related Art

The so-called "eight semiconductor processes" include a wafer process, an oxidation process, a photolithography process, an etching process, a deposition process, a wiring 25 process, a test process, and a packaging process.

The present invention relates to a packaging process, which is one of the semiconductor processes. In general, the semiconductor packaging process includes a wafer dicing step, a die attachment step, an interconnection step, a molding step, and a packaging test step.

In a conventional semiconductor packaging process, a wafer is diced and then the packaging process is performed. In recent years, however, a wafer level packaging process in which a die is maintained in a wafer state has been performed. This process has advantages in that the packaging process and the test process are performed at once in a wafer state and then the chip is diced, whereby it is possible to reduce package production cost, compared to the conventional semiconductor packaging process.

With high-integration, high-performance, and miniaturization of a semiconductor device, various packaging techniques have been developed based on such a wafer level packaging method. In particular, research on a fan-in wafer level packaging technique and a fan-out wafer level packaging technique has been actively conducted.

In addition, with recent rapid increase in data processing amount, a chiplet concept has been introduced instead of a conventional system-on-chip (SoC) concept. According to the chiplet concept, different chips (modules) are manufactured from different wafers, and the manufactured different chips are integrated into a chip. That is, the chiplet concept is to connect chips manufactured from different wafers, thereby forming an SOC having any desired function.

Also, in such a wafer level packaging method, research on heterogeneous integration techniques of packaging heterogeneous chips having different functions on a single substrate, such as 2D packaging, 2.5D packaging, and 3D packaging, has been actively conducted in order to further improve the degree of integration.

Research on such a chiplet packaging concept has been conducted from various angles due to increase in data processing amount and processing speed caused by recent upsurge of semiconductor markets; however, trace design is limited due to spatial restriction thereof, as shown in FIG. 1.

That is, trace routing density is high, whereby connection between chips is difficult, and the degree of interference between traces is high, whereby a possibility of short circuit or a signal transmission error is high and I/O count is limited.

SUMMARY OF THE INVENTION

The present invention has been made in view of the above problems, and it is an object of the present invention to provide a fan-out packaging device using a bridge configured such that, in a fan-out packaging process, a bridge for auxiliary connection between chips is introduced, whereby trace routing density is reduced, and therefore the degree of freedom in trace design is improved, and a method of manufacturing the fan-out packaging device.

In accordance with an aspect of the present invention, the above and other objects can be accomplished by the provision of a fan-out packaging device using a bridge, the fan-out packaging device including a bridge formed at one side of a fan-out package having two or more dies integrated therein, at least one trace formed at the bridge, and a connection terminal formed at an end of the trace, the connection terminal being in contact with a contact terminal of the fan-out package, wherein the different dies integrated in the fan-out package are electrically connected to each other via the bridge.

In accordance with another aspect of the present invention, there is provided a method of manufacturing a fan-out packaging device using a bridge, the method including preparing a bridge provided with a trace and a connection terminal, locating the bridge at one side of a fan-out package having two or more dies integrated therein, performing electrical contact between the trace and the connection terminal of the bridge and a contact terminal of the fan-out package, wherein the different dies integrated in the fan-out package are electrically connected to each other via the bridge.

The bridge may be any one of a silicon substrate, a polymer substrate, a ceramic substrate, an organic and inorganic composite material substrate, and a glass fiber impregnated substrate. In addition, the bridge may include a polymer resin in the substrate, and the polymer resin may include an epoxy-based insulative resin or a polyimide-based resin.

The trace may be formed on one surface or each of opposite surfaces of the bridge. The trace may be constituted by a plurality of columns or rows. The trace may be formed in a straight line, a curved line, a bent line, or a combination of two or more thereof. In addition, the trace may be embedded or surface-mounted.

The connection terminal may be constituted by any one of a metal connection portion, a solder bump, and a solder bump pillar or a mixture thereof. The metal connection portion may be formed on a via formed at the bridge, or the solder bump may be formed on a solder pad formed at the bridge.

In addition, the connection terminal may be formed outside or inside the die of the fan-out package.

When the fan-out packaging device is integrated in a silicon interposer or package substrate through the medium of the bridge, the height difference may be formed between the contact terminals or the connection terminals in order to offset the height difference from the bridge, whereby horizontal contact with the silicon interposer or package substrate may be achieved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

The present invention relates to a fan-out packaging device using a bridge configured such that, in a fan-out packaging process, a bridge for auxiliary connection between chips is introduced, whereby trace routing density is reduced, and therefore the degree of freedom in trace design is improved, and a method of manufacturing the fan-out packaging device using the bridge for auxiliary connection.

Hereinafter, embodiments of the present invention will be described in detail with reference to the accompanying drawings.

Figure 2:
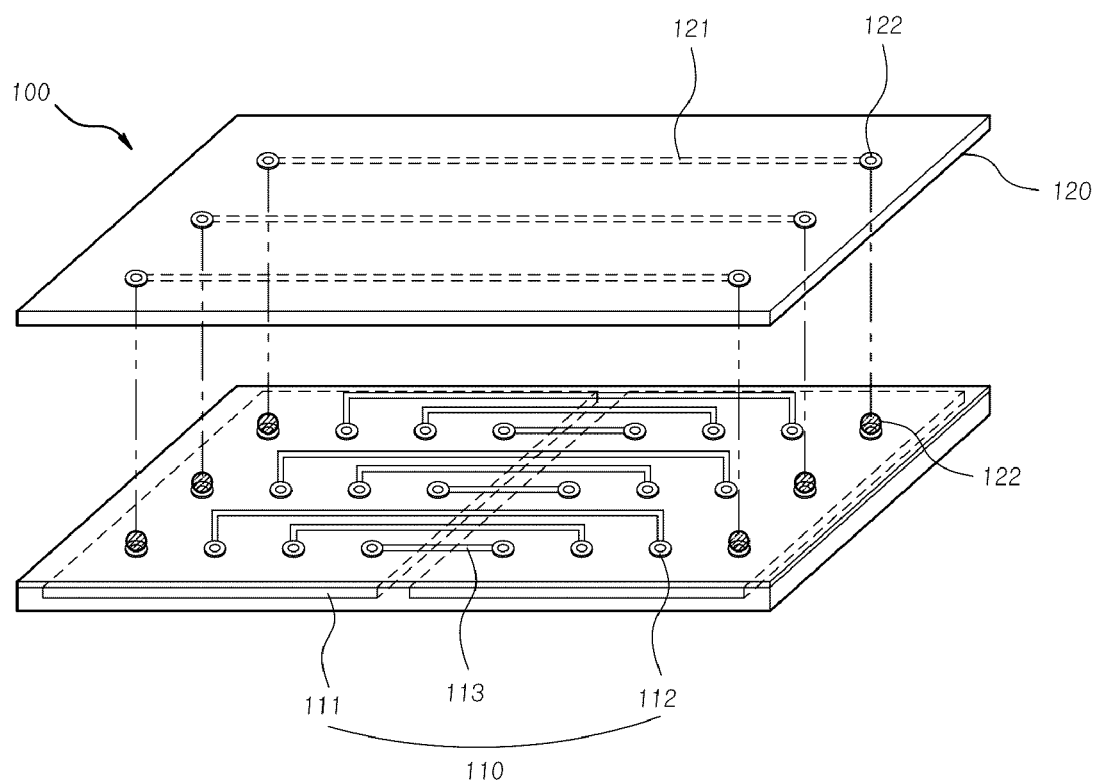
FIG. 2 is a schematic view of a fan-out packaging device using a bridge according to an embodiment of the present invention.
Figure 3:
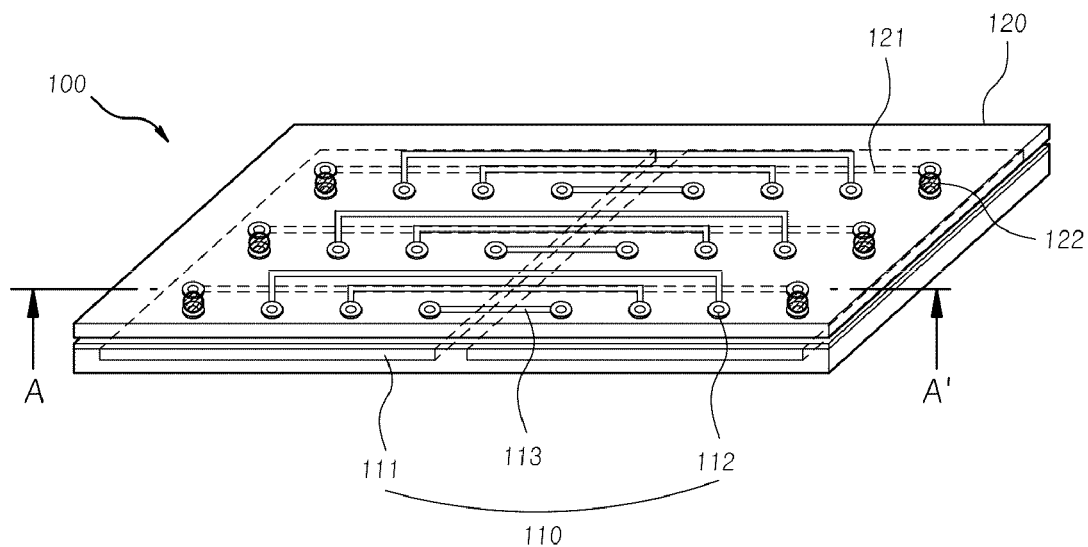
FIG. 3 is an assembled schematic view of the embodiment of FIG. 2.
Figure 4:
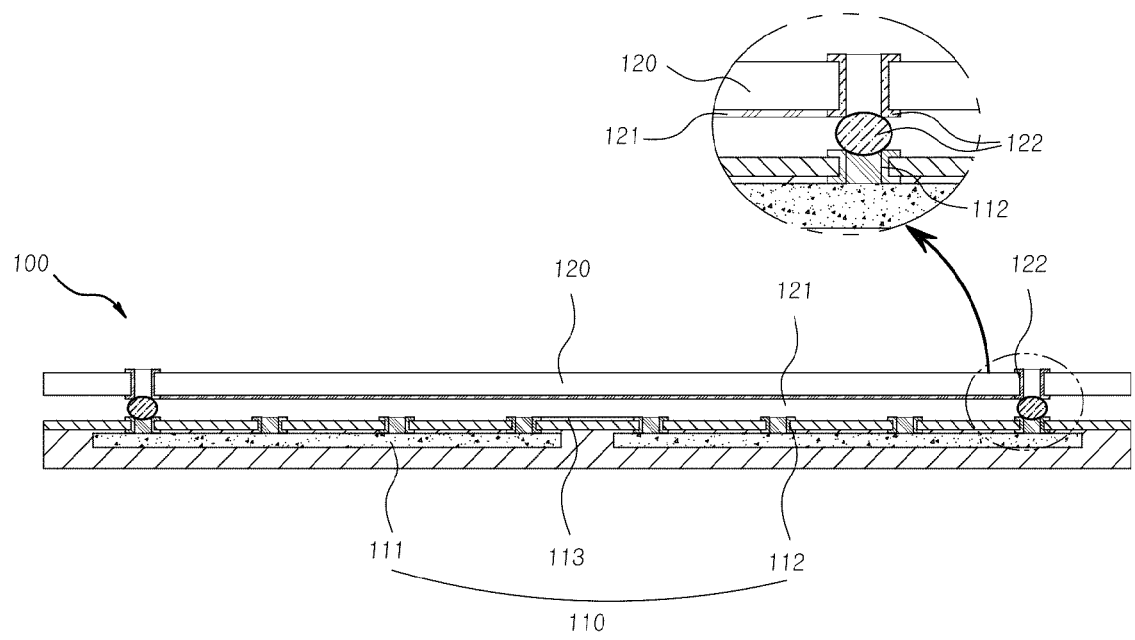
FIG. 4 is a sectional schematic view of the embodiment of FIG. 2.
Figure 5:
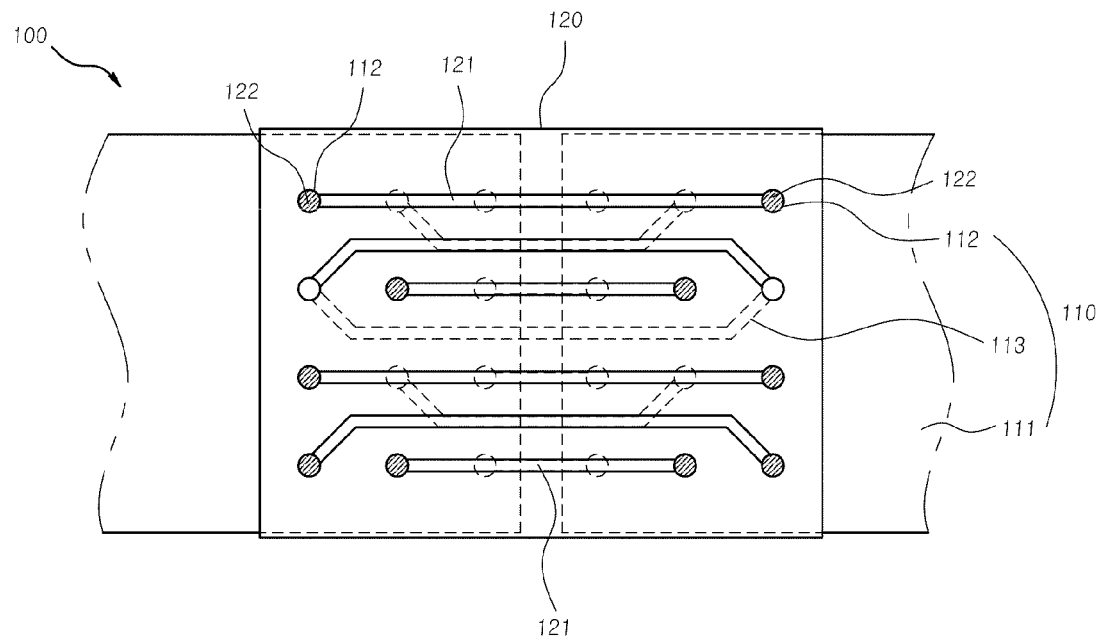
FIG. 5 is a schematic view of a fan-out packaging device using a bridge according to another embodiment of the present invention.
Figure 6A:
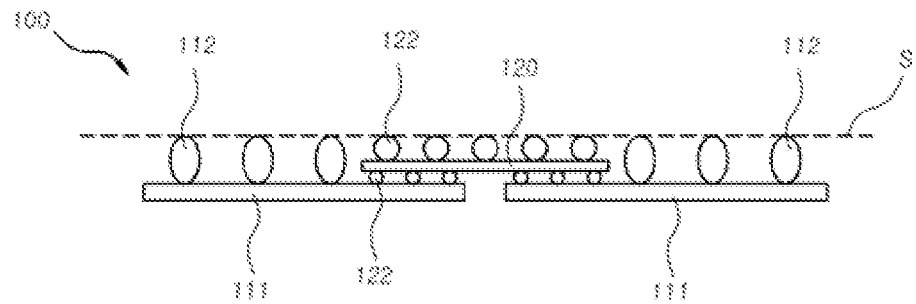
FIGS. 6A and 6B are schematic views of fan-out packaging devices using bridges according to other embodiments of the present invention.
Figure 6B:
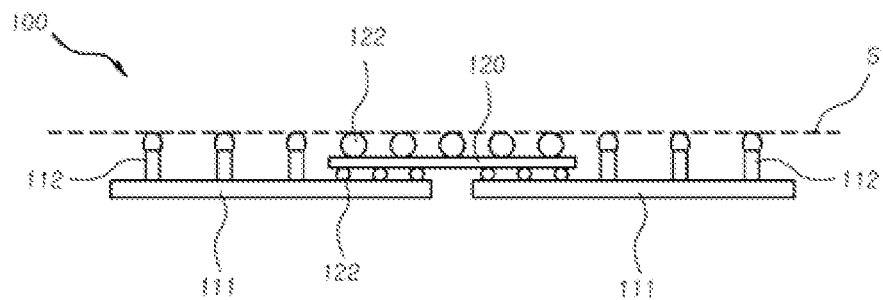

FIG. 2 is a schematic view of a fan-out packaging device using a bridge according to an embodiment of the present invention, FIG. 3 is an assembled schematic view of the embodiment of FIG. 2, FIG. 4 is a sectional schematic view of the embodiment of FIG. 2, FIG. 5 is a schematic view of a fan-out packaging device using a bridge according to another embodiment of the present invention, and FIGS. 6A and 6B are schematic views of fan-out packaging devices using bridges according to other embodiments of the present invention.

As shown, a fan-out packaging device 100 using a bridge 120 according to the present invention includes a bridge 120 formed at one side of a fan-out package 110 having two or more dies 111 integrated therein, at least one trace 121 formed at the bridge 120, and a connection terminal 122 formed at an end of the trace 121, the connection terminal 122 being in contact with a contact terminal 112 of the fan-out package 110, wherein the different dies integrated in the fan-out package 110 are electrically connected to each other via the bridge.

In addition, a method of manufacturing a fan-out packaging device 100 using a bridge 120 according to the present invention includes a step of preparing a bridge 120 provided with a trace 121 and a connection terminal 122, a step of locating the bridge 120 at one side of a fan-out package 110 having two or more dies 111 integrated therein, a step of performing electrical contact between the trace 121 and the connection terminal 122 of the bridge 120 and a contact terminal 112 of the fan-out package 110, wherein the different dies 111 integrated in the fan-out package 110 are electrically connected to each other via the bridge.

A fan-out package 110 according to an embodiment of the present invention has two or more dies (chips) 111 integrated therein, wherein the fan-out package 110 may be variously implemented, such as an embedded type fan-out package formed by molding or a surface mounted type fan-out package.

In the present invention, the terms "die" and "chip" are the same in concept, and are appropriately selected and used as needed.

Meanwhile, in the embedded type fan-out package 110, chips formed on a silicon wafer are diced, chips confirmed to normally operate are located on a carrier wafer through reconstitution, a redistribution layer (RDL) is formed in each chip and a fan-out area, a solder bump or a solder pad is formed, and dicing is performed in units of each chip or chiplet (module).

The solder bump or a solder pad according to the redistribution layer forms input and output terminals (I/O) at the fan-out package 110, and serves as a contact terminal 112 for connection between different modules or chips.

With high performance of electronic devices and increase in data processing amount, the number of chips for data processing has been increased, and as the number of input and output terminals (I/O) is increased, the fan-out package 110 has been advantageously used. In addition, as the result of integration of one or more chips, a highly integrated multifunctional module or package is provided.

Figure 1:
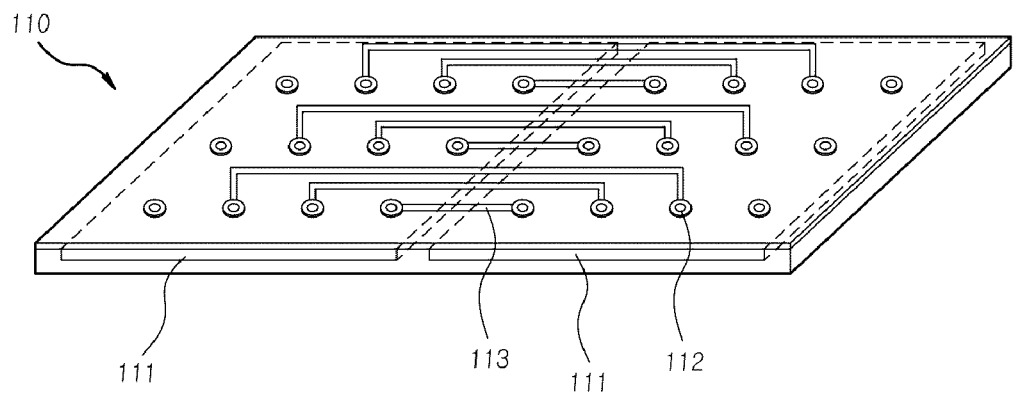
FIG. 1 is a schematic view of fan-out packaging.

In the conventional fan-out package 110 having two or more dies 111 embedded therein, as shown in FIG. 1, routing of the trace 113 is limited due to spatial restriction even though the input and output terminals (I/O) are redistributed. As a result, connection between dies (chips) 111 is not easy, and much effort and cost are incurred in a design process thereof, and density increases depending on the kind of the die, whereby a possibility of short circuit or a signal transmission error increases.

In the present invention, the bridge 120 is formed at one side of the fan-out package 110 in order to perform connection between chips. The bridge 120 according to the embodiment of the present invention is formed at one side of the fan-out package 110, preferably on the chip or the redistribution layer. That is, for a chip front structure package, the bridge may be formed at a lower side of the package, and for a chip back structure package, the bridge may be formed at an upper side of the package. The bridge may be formed at each of the upper and lower sides of the package.

In addition, the bridge 120 according to the embodiment of the present invention may be formed between the chips, may be formed at the total surface of the chip, or may be formed so as to be larger or smaller than the total surface of the chip depending on the shape of the die 111 or the disposition or location of the input and output terminals.

The bridge 120 according to the embodiment of the present invention may be made of an electrically insulative material, may also be made of an electrochemically stable and easily shapeable material, and may be formed in various shapes depending on the shape of the dies 111 that are electrically connected to each other or the disposition of the input and output terminals.

The bridge is preferably formed in a thin flat quadrangular shape, and may be made of a rigid material or a flexible material. For example, an inorganic material, an organic material, or an organic and inorganic composite material may be used.

In an embodiment of the present invention, any one of a silicon substrate, a polymer substrate, a ceramic substrate, an organic and inorganic composite material substrate, and a glass fiber impregnated substrate may be used as the bridge 120.

In addition, the bridge 120 may include a polymer resin in the substrate, and the polymer resin may include an epoxy-based insulative resin or a polyimide-based resin.

When the polymer resin is included, an epoxy-based insulative resin, such as FR-4, bismaleimide triazine (BT), or Ajinomoto build up film (ABF), may be included.

The bridge 120 configured to assist in connection between chips may be simultaneously packaged in a die molding packaging process or may be disposed at a predetermined position for connection between chips after die molding, as needed.

In addition, at least one trace 121 is formed at the bridge 120 according to the present invention. The trace 121 may be formed so as to have one or more wires in consideration of a signal transmission speed depending on disposition of a contact terminal 112 of a chip to be connected (a solder bump or a solder pad when the redistribution layer is formed).

In addition, the trace 121 is constituted by a plurality of columns or rows, and may be formed in any of various patterns, such as a straight line, a curved line, a bent line, a line diverging into two or more parts, or various combinations thereof.

The trace 121 may be formed on the substrate using a vacuum deposition method, such as sputtering, and may be formed on one surface or each of opposite surfaces of the bridge 120, may be embedded (molded) in the substrate, or may be mounted on the surface of the substrate.

A connection terminal 122 configured to be connected to the contact terminal 112 of the fan-out package 110 may be formed at an end of the trace 121.

The contact terminal 112 of the fan-out package 110 is generally formed in the chip area and the fan-out area as a solder pad or solder bump according to the redistribution layer (RDL) for connection between chips, and the solder bump or solder pad may be input and output terminals.

The redistribution layer may be formed as the result of the trace 113 for input and output terminals being routed in the chip area and the fan-out area according to routing design of the trace 113 for connection between chips, and the end of the trace 113 may be finished with a solder bump or solder pad.

The connection terminal 112 is electrically connected to the contact terminal 112 of the fan-out package 110, and a metal connection portion (e.g. through silicon via (TSV)), a solder bump, and a solder bump pillar may be used alone or in a mixed state in consideration of the shape of the contact terminal 112 of the fan-out package 110, the shape of the die 111 or the height of the chip and the bridge 120, and contact distance from the package substrate or a silicon interposer S.

Here, the connection terminal 122 may be formed on the via formed at the bridge 120 or may be formed on the solder pad formed at the bridge 120 depending on the mounting type of the trace 121.

For example, the metal connection portion may be formed on the via formed at the bridge 120 using an electroless electroplating method, or the solder bump may be formed on the solder pad. The solder bump pillar may be formed on the solder pad or a predetermined deposition layer so as to have a pillar and solder bump structure.

In the embodiment of the present invention shown in FIGS. 2 to 4 traces 121 arranged at uniform pitch are formed at one side (upper side and/or lower side) of the bridge 120, and connection terminals 122 are formed at opposite ends of each trace 121.

In the embodiment of FIGS. 2 to 4, for connection between chips, the bridge 120 is formed so as to have a similar size to the total surface of the chip, and three straight rows of traces 121 having the same size are formed at the bridge 120.

In this case, the outermost contact terminal 112 and the connection terminal 122 of the trace 121 formed at the bridge 120 are designed so as to be connected to each other for connection between chips, whereby the traces are dispersed at the bridge 120 while connection between all contact terminals 112 of the chip is achieved, and therefore trace routing density is reduced.

In the embodiment of FIG. 4, it is shown that connection terminals 122 are formed at opposite ends of the trace 121, vias are formed in the bridge 120, and a metal connection portion is formed in each via (the via may be filled with a metal pillar although the metal connection portion is formed on only an inner surface of the via in the figure), and a solder pad is formed on an outer surface of the via.

If the trace 121 is formed at a lower surface of the bridge 120, no via may be formed, the connection terminal 122 may be implemented by a combination of a solder pad and a solder bump, and the via and the metal connection portion may be formed in order to improve utilization.

The structure of the connection terminal 122 is designed in consideration of the shape of the contact terminal 112 of the fan-out package 110, the shape of the die 111 or the height of the chip and the bridge 120, and contact distance from the package substrate or the silicon interposer S, as described above.

Each of the trace 121 and the connection terminal 122 may be made of a conductive metal, such as copper, and the trace 121 and the connection terminal 122 may be simultaneously or sequentially manufactured. That is, according to design of the bridge 120, the trace 121 may be formed after the connection terminal 122 is formed, or the connection terminal 122 may be formed after the trace 121 is formed.

Also, in the fan-out package 110, the connection terminal 122 may be located outside or inside the die 111. When the connection terminal 122 is located outside the die 111, it is possible to further reduce trace (121) routing density.

This is appropriately designed in consideration of the kind of the chip and the signal transmission distance.

FIG. 5 shows the case in which a bridge 120 having a predetermined size is formed between chips for connection between the chips, wherein disposition of a trace 113 directly connected between the chips and a trace 121 formed at the bridge 120 in a dispersed state in order to reduce trace density are schematized. This is designed such that routing density is reduced according to the routing design of the trace 113 directly connected between the chips and such that bridge trace (121) routing is appropriately dispersed in consideration of the signal transmission speed.

In the embodiment of FIG. 5, a combination of bent trances 121 having different lengths is formed in order to reduce routing density, wherein the bridge 120 is introduced to packaging of a chip having more input and output terminals than in the embodiment of FIGS. 2 to 4, whereby trace density is most appropriately dispersed.

The routing design of the trace formed at the bridge 120 may be configured so as to have various shapes in response to the disposition and number of the contact terminals (or the input and output terminals) 112 of the chip or the packaging and the disposition and number of the traces 113 for direct connection between the chips.

In addition, as described above, the trace 121 may be formed on one surface or each of opposite surfaces of the bridge 120 or may be formed in the bridge by molding, whereby the degree of freedom in trace design is very high.

In addition, when the fan-out packaging device is integrated in a silicon interposer or package substrate S through the medium of the bridge 120, as shown in FIGS. 6A and 6B, the height difference is formed between the contact terminals 112 (or the connection terminals 122) in order to offset the height difference from the bridge 120, whereby stable contact is implemented due to horizontal contact with the silicon interposer or package substrate S.

In the embodiments of FIGS. 6A and 6B, the bridge 120 according to the present invention is formed at one side of a connection portion between chips. In this case, the height difference from the silicon interposer or package substrate S occurs, whereby the height of the contact terminals 112 from the chip and the interposer S and the height of the contact terminals 112 (or the connection terminals 122) from the bridge 120 formed between the chips and the interposer S are formed so as to be different from each other, and therefore horizontal contact is achieved over the final interposer or package substrate S.

In an embodiment of the present invention, FIG. 6A shows that the contact terminal 112 or the connection terminal 122 is formed as a solder bump, and FIG. 6B shows that the contact terminal 112 or the connection terminal 122 is formed so as to have a solder bump pillar structure depending on the distance between the chip and the interposer S and the distance between the bridge 120 and the interposer S.

In the present invention, as described above, when connection between chips is difficult or trace routing density is too high depending on the function or shape of the chip and high I/O count in the fan-out package, the bridge is introduced for connection between the chips, whereby some routing is distributed to the bridge, and therefore the degree of freedom in trace routing design is improved and production efficiency is enhanced.

As is apparent from the above description, the present invention has an effect in that, in a fan-out packaging process, a bridge for auxiliary connection between chips is introduced, whereby some routing is distributed to the bridge in order to reduce trace routing density, and therefore the degree of freedom in trace routing design is improved.

In addition, the present invention has an effect in that, as the result of the trace routing density being reduced and the degree of freedom in trace routing design being improved, the short circuit occurrence rate is reduced, the signal transmission error is minimized, and production efficiency is enhanced.

Although the present invention has been described in detail based on concrete embodiments, those skilled in the art will appreciate that the present invention is not limited thereto and that various modifications, additions, and substitutions are possible without departing from the scope and spirit of the invention as disclosed in the accompanying claims.

What is claimed is:

1. A fan-out packaging device using a bridge, the fan-out packaging device comprising:
    a fan-out package provided in an embedded type in which two or more dies are molded and embedded in a base, where a redistribution layer is provided on the two or more dies and a fan-out area of a structure in which the two or more dies are molded, the redistribution layer is configured to form a first trace connecting the two or more dies, and a plurality of contact terminals are provided as input/output terminals in a fan-out manner on a surface of the redistribution layer opposite to a side where the two or more dies are disposed;
    a bridge formed on one side of the fan-out package having the two or more dies, and including at least one second trace formed thereon and a connection terminal formed at an end of the at least one second trace, the connection terminal being in contact with a contact terminal among the plurality of contact terminals of the fan-out package,
    wherein the bridge is disposed on the redistribution layer and disposed at an opposite side to a side where the two or more dies are placed, and the two or more dies included in the fan-out package are electrically connected to each other via the at least one second trace of the bridge.

2. The fan-out packaging device according to claim 1, wherein the bridge is any one of a silicon substrate, a polymer substrate, a ceramic substrate, an organic and inorganic composite material substrate, and a glass fiber impregnated substrate.

3. The fan-out packaging device according to claim 2, wherein
    the bridge comprises a polymer resin in the substrate, and
    the polymer resin comprises an epoxy-based insulative resin or a polyimide-based resin.

4. The fan-out packaging device according to claim 1, wherein the at last one second trace is formed on one surface or each of opposite surfaces of the bridge.

5. The fan-out packaging device according to claim 1, wherein
    the at last one second trace is constituted by a plurality of columns or rows, and
    the at last one second trace is formed in a straight line, a curved line, a bent line, or a combination of two or more thereof.

6. The fan-out packaging device according to claim 1, wherein the at last one second trace is embedded in or surface-mounted on the bridge.

7. The fan-out packaging device according to claim 1, wherein the connection terminal is constituted by any one of a metal connection portion, a solder bump, and a solder bump pillar or a mixture thereof.

8. The fan-out packaging device according to claim 1, wherein, when the fan-out packaging device is integrated in a silicon interposer or package substrate through the medium of the bridge, a height difference is formed between the contact terminals or the connection terminals in order to offset a height difference from the bridge, whereby horizontal contact with the silicon interposer or package substrate is achieved.

9. A method of manufacturing a fan-out packaging device using a bridge, the method comprising:
    preparing a fan-out package, the fan-out package being provided in an embedded type in which two or more dies are molded and embedded in a base, where a redistribution layer is provided on the two or more dies and a fan-out area of a structure in which the two or more dies are molded, the redistribution layer is configured to form a first trace connecting the two or more dies, and a plurality of contact terminals are provided as input/output terminals in a fan-out manner on a surface of the redistribution layer opposite to a side where the two or more dies are disposed;

preparing a bridge provided with at least one second trace and a connection terminal formed at an end of the at least one second trace;

locating the bridge on one side of the fan-out package having the two or more dies; and performing electrical contact between the connection terminal of the bridge and a contact terminal among the plurality of contact terminals of the fan-out package, wherein the bridge is disposed on the redistribution layer and disposed at an opposite side to a side where the two or more dies are placed, and the two or more dies included in the fan-out package are electrically connected to each other via the at least one second trace of the bridge.

10. The method according to claim 9, wherein the bridge is any one of a silicon substrate, a polymer substrate, a ceramic substrate, an organic and inorganic composite material substrate, and a glass fiber impregnated substrate.

11. The method according to claim 10, wherein the bridge comprises a polymer resin in the substrate, and the polymer resin comprises an epoxy-based insulative resin or a polyimide-based resin.

12. The method according to claim 9, wherein the at least one second trace is formed on one surface or each of opposite surfaces of the bridge.

13. The method according to claim 9, wherein the at least one second trace is constituted by a plurality of columns or rows, and the at least one second trace is formed in a straight line, a curved line, a bent line, or a combination of two or more thereof.

14. The method according to claim 9, wherein the at least one second trace is embedded in or surface-mounted on the bridge.

15. The method according to claim 9, wherein the connection terminal is constituted by any one of a metal connection portion, a solder bump, and a solder bump pillar or a mixture thereof.

16. The method according to claim 9, wherein, when the fan-out packaging device is integrated in a silicon interposer or package substrate through the medium of the bridge, a height difference is formed between the contact terminals or the connection terminals in order to offset a height difference from the bridge, whereby horizontal contact with the silicon interposer or package substrate is achieved.

\* \* \* \* \*